(12) United States Patent
Shreeram et al.

(10) Patent No.: US 12,432,943 B2
(45) Date of Patent: Sep. 30, 2025

(54) OVER-SCULPTED STORAGE NODE

(71) Applicant: Micron Technology, Inc., Boise, ID (US)

(72) Inventors: Devesh Dadhich Shreeram, Meridian, ID (US); Sanjeev Sapra, Boise, ID (US); Kangle Li, Boise, ID (US); Sevim Korkmaz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 515 days.

(21) Appl. No.: 17/944,649

(22) Filed: Sep. 14, 2022

(65) Prior Publication Data
US 2024/0088211 A1    Mar. 14, 2024

(51) Int. Cl.
*H10D 1/00*    (2025.01)
*H10B 12/00*   (2023.01)
*H10D 1/68*    (2025.01)

(52) U.S. Cl.
CPC ............ *H10D 1/043* (2025.01); *H10D 1/042* (2025.01); *H10D 1/712* (2025.01); *H10D 1/716* (2025.01); *H10B 12/00* (2023.02); *H10B 12/033* (2023.02)

(58) Field of Classification Search
CPC .. H10B 12/31; H10B 12/377; H10B 12/0387; H10B 12/00; H10B 12/033; H10D 1/711; H10D 1/716; H10D 1/043; H10D 1/042; H10D 1/712; H10D 62/57
See application file for complete search history.

(56) References Cited

U.S. PATENT DOCUMENTS

| | | | |
|---|---|---|---|
| 10,607,995 B2 | 3/2020 | Roberts et al. | |
| 10,811,419 B1* | 10/2020 | Shreeram | H10B 12/37 |
| 2018/0323200 A1 | 11/2018 | Tang et al. | |
| 2019/0103406 A1 | 4/2019 | Tang et al. | |
| 2019/0164985 A1 | 5/2019 | Lee et al. | |
| 2021/0013226 A1 | 1/2021 | Tang et al. | |
| 2021/0257371 A1* | 8/2021 | Son | H10B 12/033 |

* cited by examiner

*Primary Examiner* — Jose R Diaz
(74) *Attorney, Agent, or Firm* — Brooks, Cameron & Huebsch, PLLC

(57) ABSTRACT

Methods, apparatuses, and systems related to an over-sculpted storage node are described. An example method includes forming an opening in a pattern of materials. The method further includes performing an etch to over-sculpt the opening. The method further includes depositing a storage node material in the over-sculpted opening to form an over-sculpted storage node. The method further includes performing an etch to remove portions of the pattern of materials. The method further includes performing an etch on the storage node material to trim the over-sculpted storage node.

19 Claims, 9 Drawing Sheets

OVER-SCULPTED STORAGE NODE

TECHNICAL FIELD

The present disclosure relates generally to semiconductor devices and methods, and more particularly to an over-sculpted storage node.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
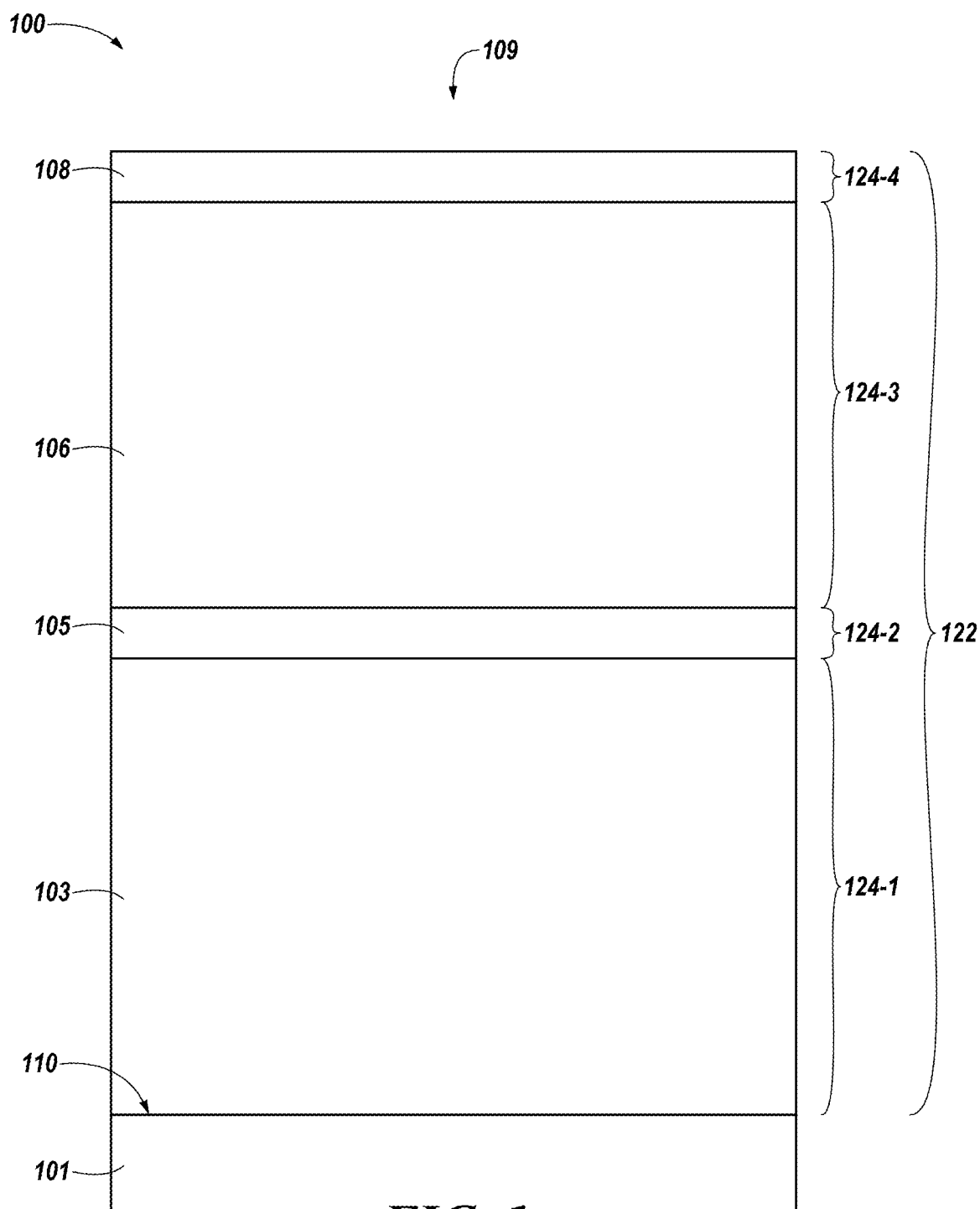
FIGS. 1-7 illustrate cross-sectional views of a portion of a semiconductor structure of a memory device in association with a semiconductor fabrication sequence for an over-sculpted storage node in accordance with a number of examples of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a working surface. Such openings may contain, or be associated with, various materials that contribute to data access, storage, and/or processing, or to various support structures, on the memory device. As an example, capacitor material may be deposited into these openings to provide the data access, storage, and/or processing.

Semiconductor structures are typically formed with lattice support materials and sacrificial materials. Openings may be formed through a pattern of materials of the semiconductor structure. In some previous approaches, an etchant process can create openings in a semiconductor structure but as a result may cause a given degree of roughness on materials exposed to an etchant. Subsequent processes/etches may be needed in an attempt to remove the roughness and/or ensure a straighter resultant profile. However, the subsequent processes/etches may be insufficient to remove the given degree of roughness and/or may not result in a sufficiently straight resultant profile. The presence of the residual roughness and/or profiles which are not sufficiently straight may increase a propensity for unintended effects such as increasing a risk of electrical shorts occurring. For instance, the presence of the residual roughness may render the semiconductor structure prone to unintended electrical shorts, particularly in the event of any wobbling or bending of the semi-conductor structure.

To address this above issues, the present disclosure includes methods, apparatuses, and systems related to an over-sculpted storage node. As an example, openings may be formed through pattern of materials of a semiconductor structure. The openings may be formed using a dry etch. A subsequent etch may be performed for a longer time (compared to conventional etches) to remove surface roughness on the capacitor materials within the semiconductor structure. The subsequent etch may be a dry or vapor etch. The subsequent etch may over-sculpt the opening, resulting in at least one wider distal end, than would otherwise be realized for a etch performed for a shorter duration of time. A storage node material may be deposited in the over-sculpted opening and subsequently be trimmed to form an over-sculpted storage node. The process provides both smoother and straighter storage nodes (e.g., bottom electrodes), than other storage node materials formed by other methods such as those which employ shorter etches and/or different materials/etchants.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 108 may reference element "08" in FIG. 1, and a similar element may be referenced as 208 in FIG. 2. In some instances, a plurality of similar, but functionally and/or structurally distinguishable, elements or components in the same figure or in different figures may be referenced sequentially with the same element number (e.g., 124-1, 124-2, 124-3, 124-4 in FIG. 1).

FIG. 1 illustrates a cross-sectional view 100 of a portion of a semiconductor structure of a memory device in association with a semiconductor fabrication sequence for an over-sculpted storage node in accordance with a number of examples of the present disclosure.

Figure 2:
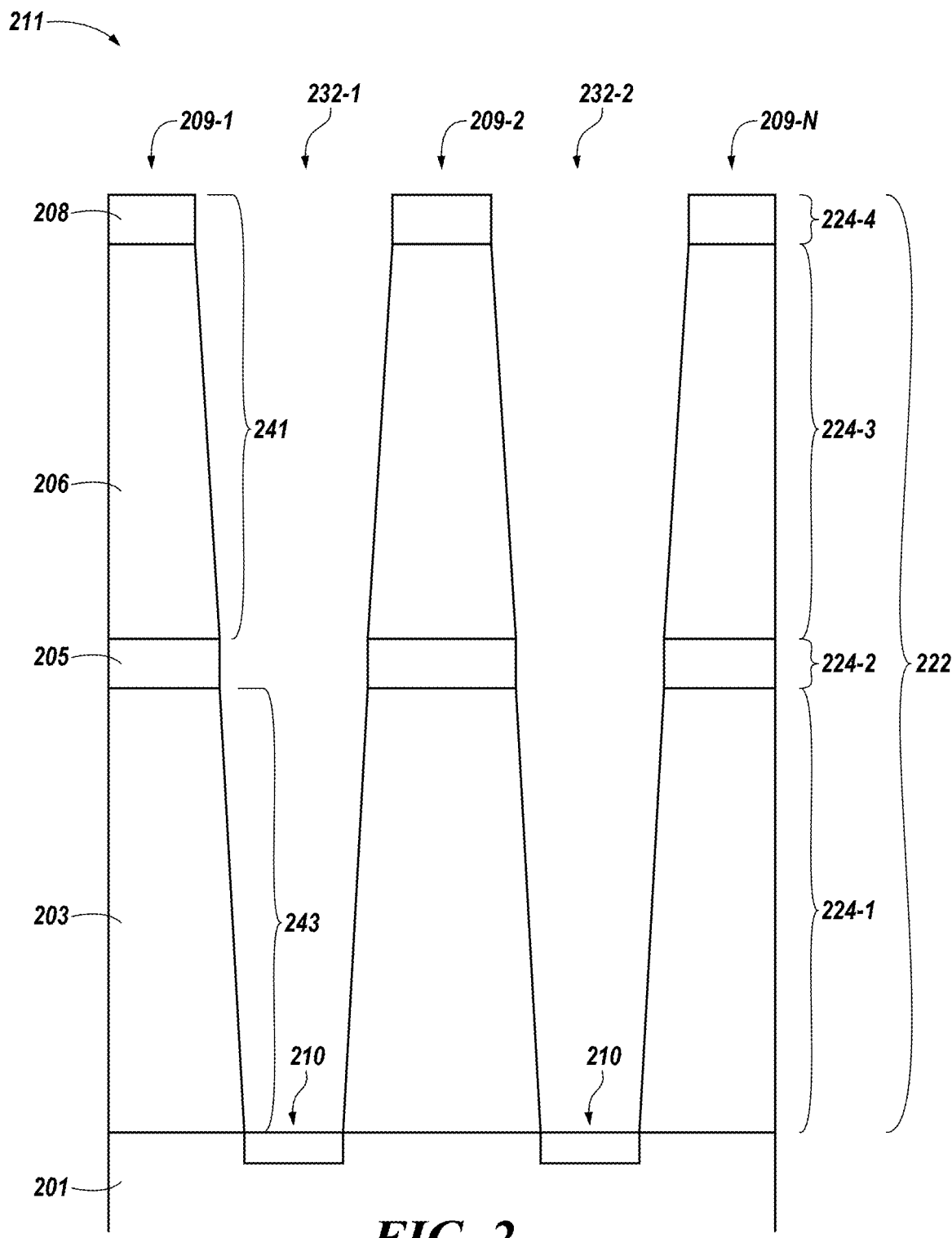

The example semiconductor structure may include a pattern of materials 109. The pattern of materials 109 may include oxide materials separated by nitride materials. A top portion and a bottom portion of the pattern of materials 109 may be formed from silicate materials. The top portion (e.g., top portion 241 as illustrated in FIG. 2) may be formed from tetraethyl orthosilicate ($Si(OC_2H_5)_4$), which is also referred to as TEOS while the bottom portion (e.g., the bottom portion 243 as illustrated in FIG. 2) can be formed from borophosphosilicate glass (BPSG). However, in some examples, the top portion and/or the bottom portion can be formed of different materials.

The pattern of materials 109 may be formed over an underlying working surface 101. The working surface 101 may be formed from various undoped or doped materials on which memory device materials may be fabricated. Examples of a relatively inert undoped working surface 101 may include monocrystalline silicon (monosilicon), polycrystalline silicon (polysilicon), and amorphous silicon, among other possibilities.

The pattern of materials 109 may include a first silicate material 103. The first silicate material 103 may, in a number of examples, have been formed from BPSG. The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, and/or formation of the first silicate material 103, as described herein.

The first silicate material 103 may be originally formed (e.g., deposited) on a surface 110 of the working surface 101. For example, the first silicate material 103 may be formed without an opening formed therein from an upper surface of the first silicate material 103 to the surface 110 of the working surface 101. The first silicate material 103 may, in a number of examples, be deposited to a thickness in a range of approximately 200 nanometers (nm) to approximately 600 nm above the surface 110 of the working surface 101. However, embodiments of the present disclosure are not limited to this example.

A first nitride material 105 may be formed on a surface of the first silicate material 103 opposite from the working surface 101. The first nitride material 105 may be formed (e.g., deposited) on an upper surface of the first silicate material 103. The first nitride material 105 may be formed from a nitride material selected for dielectric properties. For example, one or more dielectric nitrides may be selected from silicon nitride ($SiN_x$, $Si_3N_4$), aluminum nitride (AlN), among other possibilities, for formation of the first nitride material 105. The first nitride material 105 may, in a number of examples, be deposited to a thickness in a range of approximately 5 nm to approximately 60 nm above the surface of the first silicate material 103. However, embodiments of the present disclosure are not limited to this example.

A second silicate material 106 may be formed on a surface of the first nitride material 105 that is opposite from the first silicate material 103. The second silicate material 106 may, in a number of examples, be formed from tetraethyl orthosilicate ($Si(OC_2H_5)_4$), which is also referred to as TEOS. TEOS may be formed as an ethyl ester of orthosilicic acid ($Si(OH)_4$), among other possibilities. The second silicate material 106 may, in a number of examples, be deposited to a thickness in a range of approximately 250 nm to 450 nm above the surface of the first nitride material 105. However, embodiments of the present disclosure are not limited to this example.

A second nitride material 108 is shown to have been formed on a surface of the second silicate material 106 opposite from the first nitride material 105. The second nitride material 108 may be formed (e.g., deposited) on an upper surface of the second silicate material 106.

Similar to the first nitride material 105, the second nitride material 108 may be formed from a nitride material selected for dielectric properties. For example, the second nitride material 108 may be formed from the same material as the first nitride material 105. The second nitride material 108 may, in a number of examples, be deposited to a thickness in a range of from approximately 20 nm to approximately 100 nm above the surface of the second silicate material 106. The working surface 101, first nitride material 105, and second nitride material 108 may form lattice support structure for the pattern of materials 109.

In at least one example, the width of the pattern of materials 109 may be within a range of approximately 200-600 Angstroms (or 20 to 60 nm). The overall height 122 of the pattern of materials 109 may be formed to a height of greater than 10,000 Angstroms. For example, the overall height 122 of the pattern of materials 109 may be within a range of approximately 10,000-15,000 Angstroms (1,000-1,500 nm) and may result in an aspect ratio (AR) of the height to width being in a range of approximately 25:1 to approximately 50:1.

Each of the materials may contribute a particular height to the overall height 122 of the structure. As is illustrated in FIG. 1, the first silicate material 103 can have a height 124-1, the first nitride material 105 can have a height 124-2, the second silicate material 106 can have a height 124-3, and the second nitride material 108 can have a height 124-4 that, when added together, equal the overall height 122.

FIG. 2 illustrates a cross-sectional view 211 of a portion of semiconductor structure of a memory device in association with a semiconductor fabrication sequence for an over-sculpted storage node in accordance with a number of examples of the present disclosure. FIG. 2 illustrates the example semiconductor structure at a particular stage following completion of the example fabrication sequence described in connection with FIG. 1.

The cross-sectional view 211 may include the same or similar elements as the example cross-sectional view 100 as referenced in FIG. 1. For example, the working surface 201 is analogous or similar to working surface 101. First silicate material 203 is analogous or similar to first silicate material 103, first nitride material 205 is analogous or similar to first nitride material 105, second silicate material 206 is analogous or similar to second silicate material 106, second nitride material 208 is analogous or similar to second nitride material 108.

After the completion of the formation of the pattern of materials 209, an etch process may be utilized to etch into (e.g., through) the pattern of materials 209. The etch process may be utilized to etch into (e.g., through) the second nitride material 208, the second silicate material 206, the first nitride material 205, the first silicate material 203 and/or working surface 201 to form an opening within the previously listed materials (as is illustrated already as opening 232-1 between the pattern of materials 209-1, 209-2, . . . , 209-N (hereinafter referred to collectively as pattern of materials 209). The etch process may be a dry etch process. The etch process may be a vapor etch process.

Performance of the etch process may allow for a formation of an opening (within which a column of electrode material can be deposited) that extends from the upper surface of the second nitride material 208 to the surface 210 of the working surface 201. For clarity in the example fabrication sequence, the figures show a first opening 232-1 and a second opening 232-2 (hereinafter referred to collectively as openings 232) but examples are not limited to two openings and may include various numbers of openings. The openings 232 may have the same height as the height 222 of the portions 209-1, 209-2, . . . , 209-N of the pattern of materials 209. For example, the overall height 222 of the openings 232 may be within a range of approximately 10,000-15,000 Angstroms (1,000-1,500 nm). The opening may extend through all the materials within the pattern of materials 209.

A subsequent etch may be performed to remove surface roughness from the pattern of materials 209. The subsequent etch may be performed using a vapor etch such as oxidative etch. The subsequent etch may be performed for a longer time than typical. For example, the subsequent etch may be performed for an amount of time in a range from 1-15 seconds. The surface roughness of the sidewalls may be reduced to be less than or equal to 1.2 nanometers (nm) or less than or equal to 1.0 nm. For instance, the surface roughness can be in a range from 0.1 to 1.2 nanometers. All individual values and subranges from 0.1 to 1.2 nanometers are included. For instance, the surface roughness of the sidewalls can be in a range from 1.0 nm to 1.2 nm. As used herein, the surface roughness of the sidewall refers to deviations in the direction of a normal vector of the sidewall. The longer subsequent etch may result in over-sculpting the sidewalls of the openings 232 and thereby form over-sculpted openings having reduced surface roughness (e.g., less than 1.2 nm or less than 1.0 nn) and/or particular dimensions. That is, the over-sculpted opening may have wider distal ends (having a greater thickness) relative to a thickness of a middle or third portion of the opening located between the distal ends. For example, the sidewalls of the openings 232 may extend from the first distal end to the second distal end.

Figure 3:
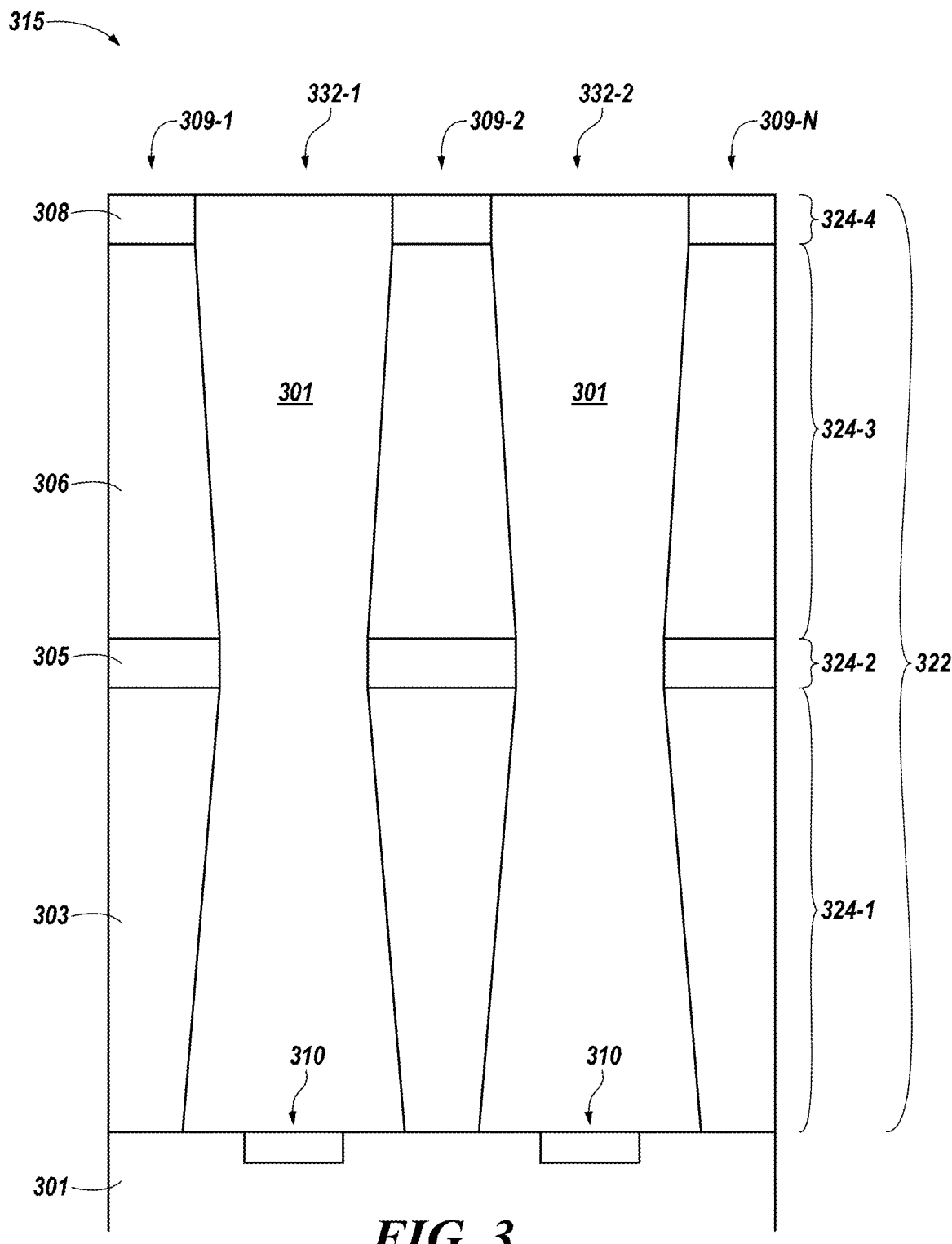

FIG. 3 illustrates a cross-sectional view 315 of a portion of semiconductor structure of a memory device in association with a semiconductor fabrication sequence for an over-sculpted storage node in accordance with a number of examples of the present disclosure. FIG. 3 illustrates the example semiconductor structure following completion of the example fabrication sequence described in connection with FIG. 2.

The cross-sectional view 315 can include the same or similar elements as the example cross-sectional views 100 and 211 as referenced in FIGS. 1 and 2, respectively. For example, the working surface 301 is analogous or similar to working surface 101 and 201 of FIGS. 1 and 2, respectively. First silicate material 303 is analogous or similar to first silicate material 103 and 203 of FIGS. 1 and 2, respectively. First nitride material 305 is analogous or similar to first nitride material 105 and 205 of FIGS. 1 and 2, respectively. Second silicate material 306 is analogous or similar to second silicate material 106 and 206 of FIGS. 1 and 2, respectively. Second nitride material 308 is analogous or similar to second nitride material 108 and 208 of FIGS. 1 and 2, respectively. Pattern of materials 309 (individually referred to as 309-1, 309-2, . . . , 309-N) is analogous or similar to pattern of materials 109 and 209 of FIGS. 1 and 2, respectively. Openings 332 (individually referred to as 332-1 and 332-2) is analogous or similar to openings 232 of FIG. 2.

A capacitor material, e.g., a storage node material 321, may be formed (e.g., deposited) within the over-sculpted openings 332. The storage node material 321 e.g., a capacitor material, may be formed (e.g., deposited) from the working surface 301 to a height 322 of the openings 332 at the upper surface of the pattern of materials 309 through a conformal deposition process such as chemical vapor deposition (CVD). For example, the inner surfaces of the openings 332 may be covered by the storage node material 321. The storage node material 321 may be deposited in the shape of the over-sculpted opening.

The storage node material 321 may be formed from a nitride compound material selected for conductive properties. For example, one or more conductive nitrides may be selected from gallium nitride (GaN), tantalum nitride (TaN, $Ta_2N$), titanium nitride (TiN, $Ti_2N$), aluminum doped titanium nitride (TiAlN), silicon doped titanium nitride (TiSiN), boron doped titanium nitride (TiBN), and tungsten nitride (WN, $W_2N$, $WN_2$), among other possibilities. The storage node material 321 may be formed to various widths (e.g., thicknesses) as suited to a particular design rule for the formation of an operable capacitor for a semiconductor device.

The storage node material 321 may be formed (e.g., deposited) on within the openings 323 such that the openings 323 is covered on all surfaces with the storage node material 321. That is, a height 322 of the openings 332 is covered by the storage node material 321. As an example, the height 322 of the storage node material 321 spans the height 324-1 of the first silicate material 303, the height 324-2 of the first nitride material 305, the height 324-3 of the second silicate material 306, and the height 324-4 of the second nitride material 308, that, when added together, results in the overall height 322. The storage node material 321 may have the same height as the height 322 of the portions of the pattern of materials 309. For example, the overall height 322 of the openings 332 may be within a range of approximately 10,000-15,000 Angstroms (1,000-1,500 nm).

The storage node material can have a first distal end (proximate to the second nitride material 308) and a second distal end (proximate to the surface 310 or working surface 301). The first distal end may have a first thickness 345 and the second distal end may have a second thickness 346 and a third thickness 348 may be at a location between the first distal end and the second distal end. The location of the third thickness 348 may be an interface between the top portion and the bottom portion. The top portion may be uniformly tapered from the first thickness 345 to the third thickness 348, and the bottom portion may be uniformly tapered from the second thickness 346 to the third thickness 348. The first thickness 345 and the second thickness 346 may be greater than the third thickness 348. For example, the third thickness 348 may be at least 5 angstroms less than the first thickness 345 and the second thickness 346. The first thickness 345 and the second thickness 346 may be substantially equal. As used herein, the term "substantially" intends that the characteristic needs not be absolute, but is close enough so as to achieve the advantages of the characteristic. For example, "substantially equal" is not limited to an absolute value, but can include similar values such as those within 10 percent, 5 percent, or 1 percent of a given value. All individual values and subranges from substantially about 1 percent to substantially about 10 percent are included.

Figure 4:
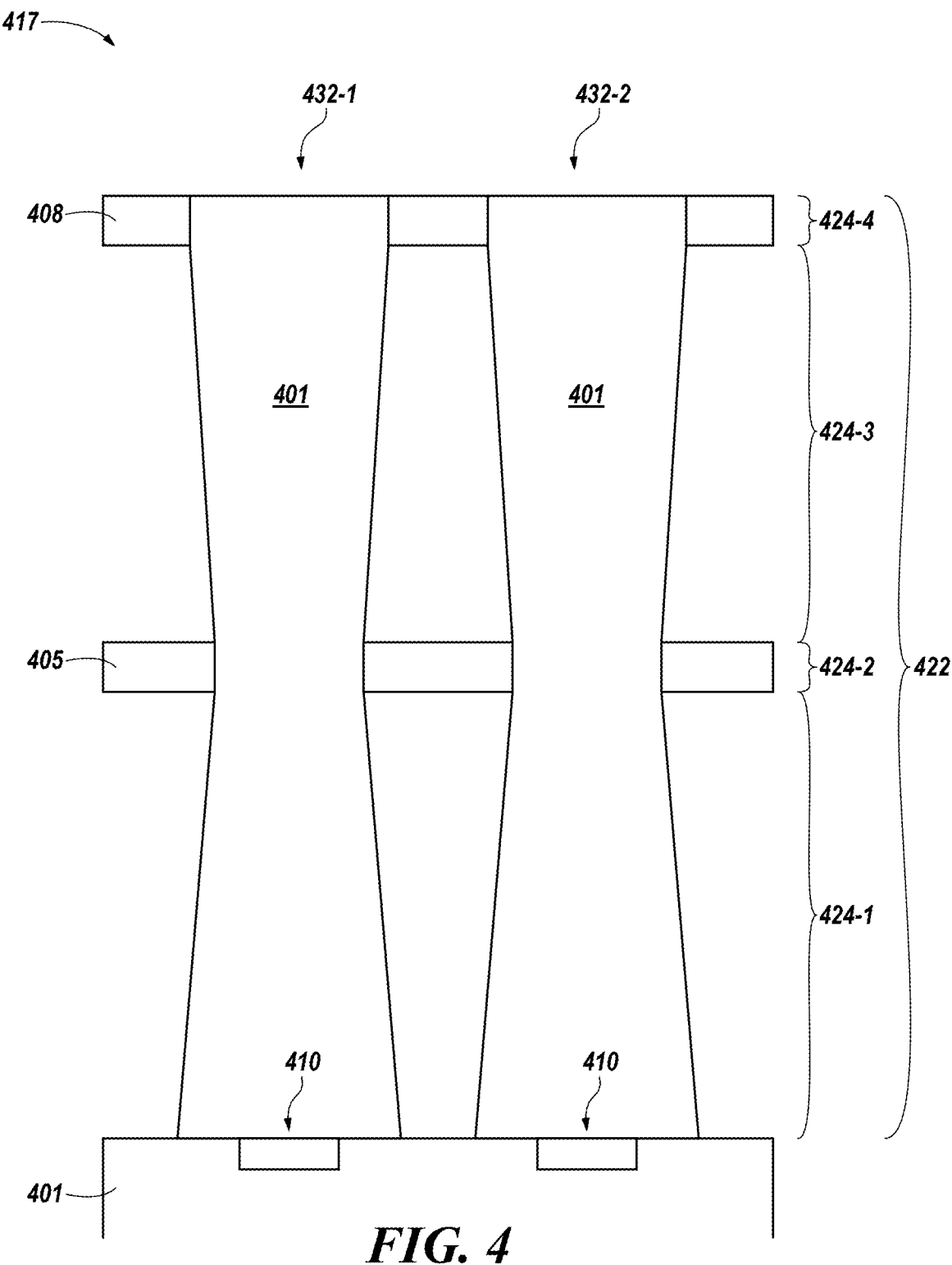

FIG. 4 illustrates a cross-sectional view 417 of a portion of semiconductor structure of a memory device in association with a semiconductor fabrication sequence for an over-sculpted storage node in accordance with a number of examples of the present disclosure. FIG. 4 illustrates the example semiconductor structure following completion of the example fabrication sequence described in connection with FIG. 3.

The cross-sectional view 417 can include the same or similar elements as the example cross-sectional views 100, 211, and 315 as referenced in FIGS. 1, 2, and 3 respectively. For example, the working surface 401 is analogous or similar to working surface 101, 201, and 301 of FIGS. 1, 2, and 3 respectively. The first nitride material 405 is analogous or similar to first nitride material 105, 205, and 305 of FIGS. 1, 2, and 3 respectively. The second nitride material 408 is analogous or similar to second nitride material 108, 208, and 308 of FIGS. 1, 2, and 3 respectively. The storage node material 421 is analogous or similar to storage node material 321 of FIG. 3. Openings 432 (individually referred to as 432-1 and 432-2) is analogous or similar to openings 232 and 332 of FIGS. 2 and 3 respectively.

In this example, the first silicate material (e.g., first silicate material 303 in FIG. 3) and the second silicate material (e.g., second silicate material 306 in FIG. 3) have been etched and recessed from the pattern of materials (e.g., pattern of materials 309 in FIG. 3). The first and second silicate materials may be removed with (via application of) a solvent that is selective for removing (e.g., dissolving) the first and second silicate materials while not removing (e.g., leaving) other materials such as the nitride lattice materials. The solvent may be a wet etch to remove the first and second silicate material. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities.

In addition, the working surface material 401, the first nitride material 405, and the second nitride material 408 may be left remaining following the application of the selective solvent, among other possible components or structural features that may remain in the semiconductor structure. The remaining working surface material 401, the first nitride material 405, and the second nitride material 408 may function as a lattice support structure, to provide support in view of the empty spaces in the semiconductor structure during the fabrication process.

The height 422 of the openings 432 may still be within a range of approximately 10,000-15,000 Angstroms (1,000-1,500 nm). As an example, the height 422 of the openings 432 spans the height 424-1 of the first silicate material 403, the height 424-2 of the first nitride material 405, the height 424-3 of the second silicate material 406, and the height 424-4 of the second nitride material 408, that, when added together, results in the overall height 422.

The storage node material 421 can have a first width 451 at a first distal end of the storage node material, a second width 452 at a second distal end of the storage node material (that is opposite the first distal end), and a third width 453 located between that first distal end and the second distal end. For instance, as illustrated in FIG. 4, the third width 453 can be taken at a center point between the first distal end and the second distal end of the storage node material. Stated differently, the third width 453 can be taken between the first and second distal ends at an equal distance from each of the first and second distal ends.

Figure 5:
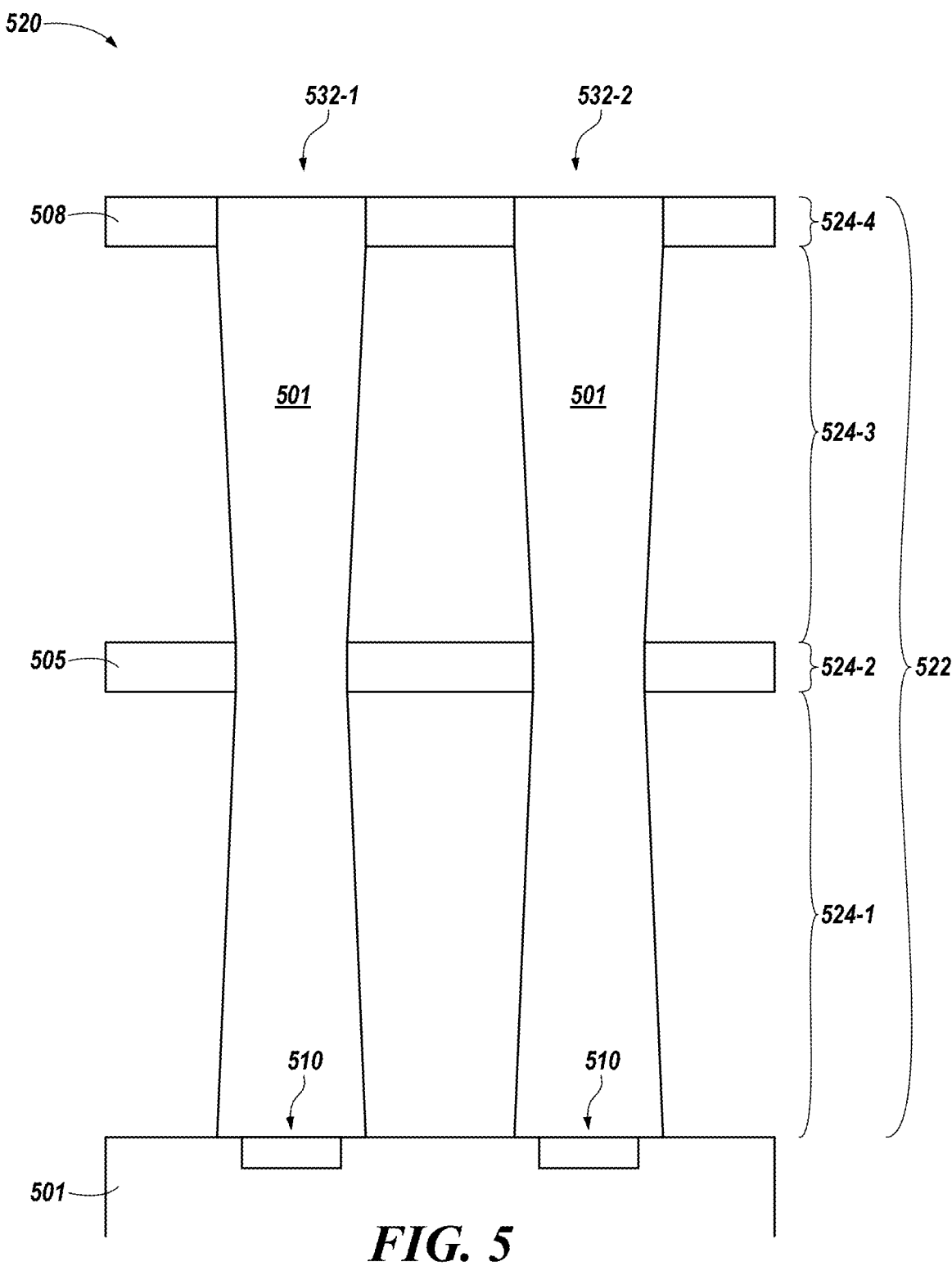

FIG. 5 illustrate cross-sectional views 502 of a portion of a semiconductor structure of a memory device in association with a semiconductor fabrication sequence for an over-sculpted storage node in accordance with a number of examples of the present disclosure. FIG. 5 illustrates the example semiconductor structure at the particular stage following completion of the example fabrication sequence described in connection with FIG. 4.

The cross-sectional view 513 can include the same or similar elements as the example cross-sectional views 100, 211, 315, and 417 as referenced in FIGS. 1, 2, 3, and 4 respectively. For example, the working surface 501 is analogous or similar to working surface 101, 201, 301, and 401 of FIGS. 1, 2, 3, and 4 respectively. The first nitride material 505 is analogous or similar to first nitride material 105, 205, 305, and 405 of FIGS. 1, 2, 3, and 4 respectively. The second nitride material 508 is analogous or similar to second nitride material 108, 208, 308, and 408 of FIGS. 1, 2, 3, and 4 respectively. The storage node material 521 is analogous or similar to storage node material 321 and 421 of FIGS. 3 and 4, respectively.

Subsequent to the removal of the silicate materials, the over-sculpted storage node material 521 is still visible. In order to straighten and/or reduce a thickness of the storage node material 521, an etch may be performed on the storage node material 521. The etch that trims the storage node material 521 may be a vapor etch or a wet etch. For instance, the etch may be a wet etch, such as a wet etch performed using ammonium hydroxide ($NH_4OH$), among other possibilities. The etch may trim the storage node material 521 to form a storage node 521 with a straighter profile. For instance, the etch may trim a first width (e.g., 451 as illustrated in FIG. 4) at a first end of the storage node material, a second width (e.g., 452 as illustrated in FIG. 4) of the storage node material, and/or a third width (e.g., 453 as illustrated in FIG. 4). For instance, the etch can trim the first width, the second width and the third width (e.g., 451, 452, and 453, respectively, as illustrated in FIG. 4) of the storage node material (e.g., 417 as illustrated in FIG. 4) to the first width, the second width, and the third width (e.g., 555, 556, and 557 as illustrated in FIG. 5). That is, the process described herein (FIGS. 1-5) may result in a storage node material that is both smooth and straight. For instance, the straighter profile can have a first thickness 555 at the first distal end that is equal to or substantially equal to the second thickness 556 at the second distal end, as compared to other approaches that have different distal end thickness and thus may be prone to issues such as electrical shorts, etc.

The height 522 of the storage node material 521 may still be within a range of approximately 10,000-15,000 Angstroms (1,000-1,500 nm). The height 522 of the storage node material 521 spans the height 524-1 of the first silicate material 503, the height 524-2 of the first nitride material 505, the height 524-3 of the second silicate material 506, and the height 524-4 of the second nitride material 308, that, when added together, results in the overall height 522.

Figure 6:
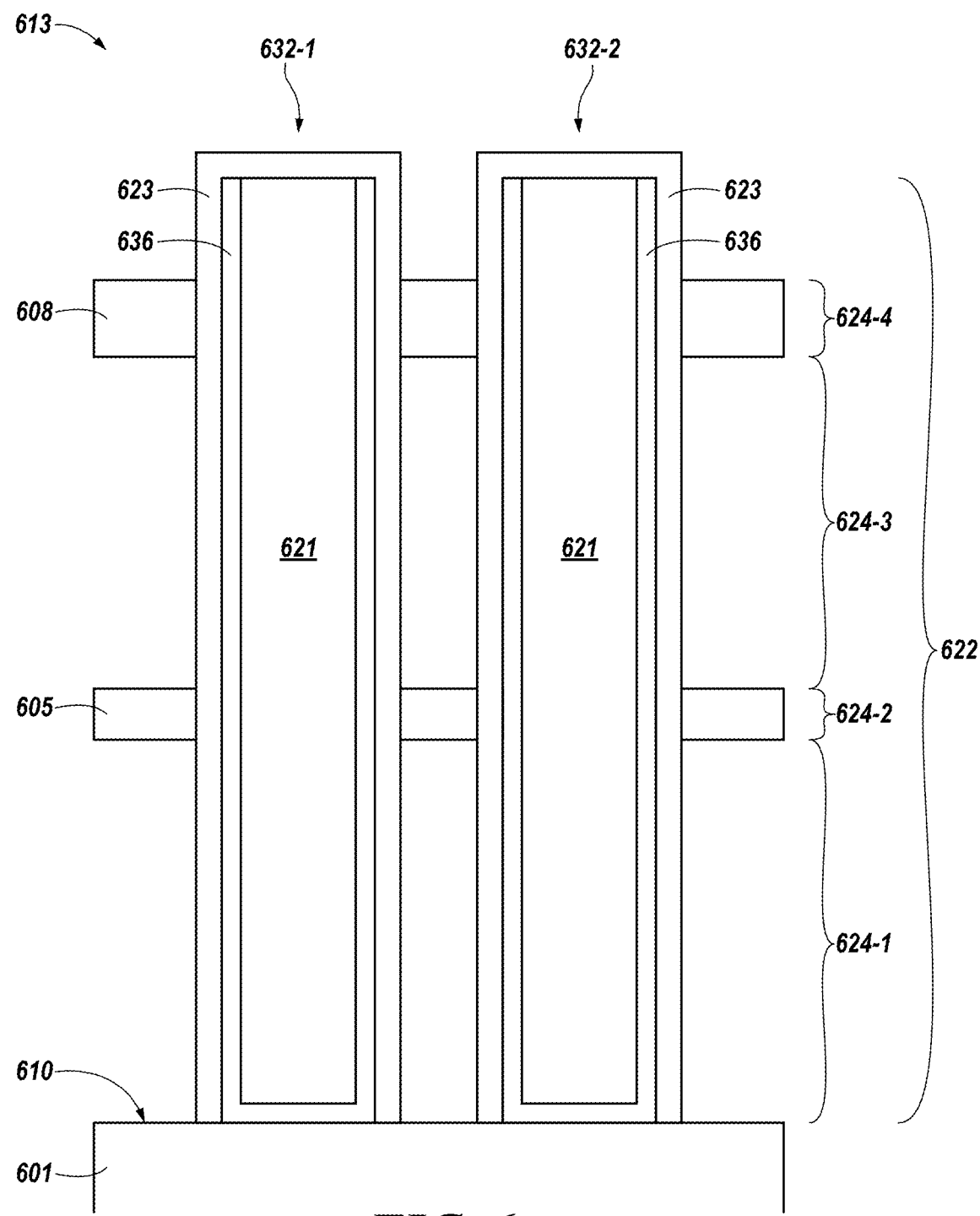

FIG. 6 illustrates a cross-sectional view 613 of a portion of an example semiconductor structure of a memory device in association with a semiconductor fabrication sequence for an over-sculpted storage node in accordance with a number of examples of the present disclosure. FIG. 6 illustrates the example semiconductor structure at the particular stage following completion of the example fabrication sequence described in connection with FIG. 5. For ease of illustration, the storage node material 621 has been illustrated as having straight sidewalls, however the sidewall of the storage node material 621 may have some degree of tapering similar to FIG. 5.

The cross-sectional view 613 can include the same or similar elements as the example cross-sectional views 100, 211, 315, and 417, and 502 as referenced in FIGS. 1, 2, 3, 4, and 5 respectively. For example, working surface 601 is analogous or similar to working surface 101, 201, 301, 401, and 501 of FIGS. 1, 2, 3, 4, and 5 respectively. For example, working surface 601 is analogous or similar to substrate material 101, 201, 301, 401, and 501 of FIGS. 1, 2, 3, 4, and 5 respectively. The first nitride material 605 is analogous or similar to first nitride material 105, 205, 305, 405, and 505 of FIGS. 1, 2, 3, 4, and 5 respectively. The second nitride material 608 is analogous or similar to second nitride material 108, 208, 308, 408, and 508 of FIGS. 1, 2, 3, 4, and 5. The storage node material 621 is analogous or similar to storage node material 321, 421, 521, and 621 of FIGS. 3, 4, and 5 respectively.

As is illustrated in FIG. 6, a bottom electrode material 636 has been formed (e.g., deposited) in openings, as described herein. The storage node material 621 has filled the openings from the surface 610 of the working surface 601 to a height 622 at the upper surface of the plurality of patterns of materials (e.g., 309-1, 309-2, and 309-N in FIG. 3).

In a number of examples, the bottom electrode material 636 may be formed from conductive materials and to various widths (e.g., thicknesses) as suited to a particular design rule for the formation of an operable capacitor for a semiconductor device. The storage node material 621 may be covered on its sidewalls with the bottom electrode material 636. The bottom electrode material 636 may be used to store a charge. As an example, the height 622 of the bottom electrode material 636 spans the height 624-1 of the removed first silicate material (e.g., 303 of FIG. 3), the height 624-2 of the first nitride material 605, the height 624-3 of the removed second silicate material (e.g., 306 of FIG. 3), the height 624-4 of the second nitride material 608 that, when added together, results in the overall height 622. As shown in FIG. 6, a dielectric material 623 has been formed (e.g., deposited) on an outer surface of the bottom electrode material 636. The dielectric material 623 may, in a number of examples, be formed from a surface 610 of the working surface 601 to cover the outer surface, including an upper surface, of the storage node material 621.

Figure 7:
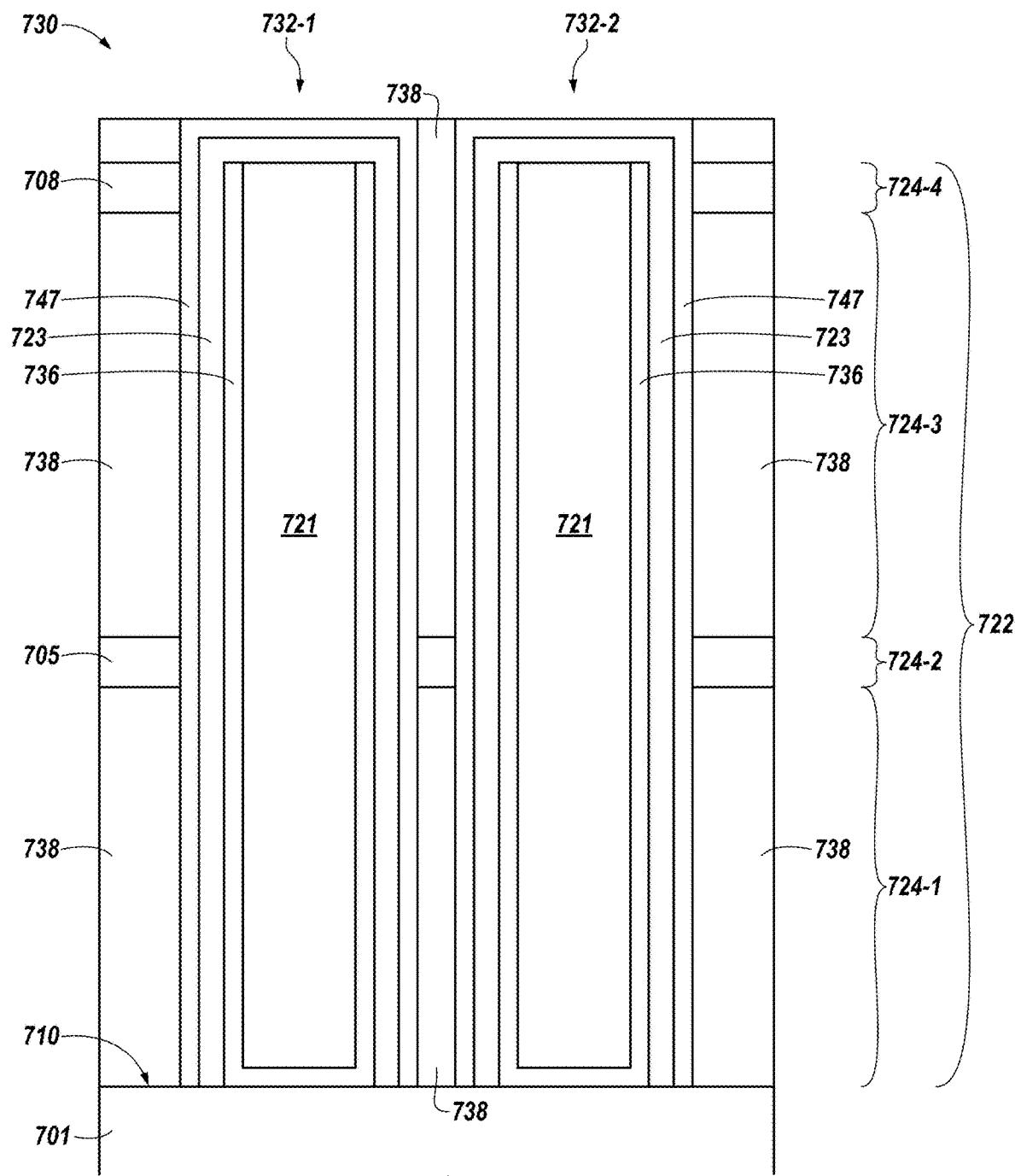

FIG. 7 illustrates a cross-sectional view 730 of a portion of an example semiconductor structure of a memory device in association with a semiconductor fabrication sequence for an over-sculpted storage node in accordance with a number of examples of the present disclosure. FIG. 7 illustrates the example semiconductor structure following completion of the example fabrication sequence described in connection with FIG. 6.

The cross-sectional view 730 can include the same or similar elements as the example cross-sectional views 100, 211, 315, and 417, 502, and 613 as referenced in FIGS. 1, 2, 3, 4, 5, and 6 respectively. For example, the working surface 701 is analogous or similar to working surface 101, 201, 301, 401, 501, and 601 of FIGS. 1, 2, 3, 4, 5, and 6 respectively. The first nitride material 605 is analogous or similar to first nitride material 105, 205, 305, 405, and 505 of FIGS. 1, 2, 3, 4, and 5 respectively. The second nitride material 608 is analogous or similar to second nitride material 108, 208, 308, 408, and 508 of FIGS. 1, 2, 3, 4, and 5 respectively. The storage node material 721 is analogous or similar to storage node material 321, 421, 521, 621, and 721 of 3, 4, 5, and 6 respectively. The bottom electrode 736 is analogous or similar to silicon fill material 636 of FIG. 6.

As shown, the dielectric material 723 has been formed (e.g., deposited) on an outer surface of the bottom electrode material 736. The dielectric material 723 may, in a number of examples, be formed from a surface 710 of the working surface 701 to cover the outer surface, including an upper surface, of the bottom electrode material 736. A capacitor material may be subsequently formed, at least in part, by formation (e.g., deposition) of a top electrode material 747 on an outer surface of the dielectric material 723. The height 722 of the silicon fill material 721 spans the height 724-1 of the removed first silicate material (e.g., 303 of FIG. 3), the height 724-2 of the first nitride material 705, the height 724-3 of the removed second silicate material (e.g., 306 of FIG. 3), the height 724-4 of the second nitride material 608 that, when added together, results in the height 722.

The example semiconductor structure illustrated in FIG. 7 shows a buffer material 738 that may be formed around and between the capacitor materials as a conductive material between cells. The dielectric material 723, the top electrode material 747, and the buffer material 738 may be formed from various respective dielectric materials, conductive materials, and resistive materials and to various width (e.g., thickness) usable in association with formation of an operable silicon fill material for a semiconductor device.

The lattice support structure is formed from a working surface 701, first nitride material 705, and the second nitride material 708. The lattice structure may provide support to the capacitor materials after the removal of the first and second materials (e.g., 303 and 306 in FIG. 3) has left voids even after such voids may have been at least partially filled by the buffer material 738. The lattice support structure formed from the working surface 701, the first and second nitride materials 705, and 708 is shown for ease of illustration in what can be a 3D-cross sectional view to be supporting behind the storage node material 721. In a number of examples, the dielectric material 723, the top electrode material 747, and/or the buffer material 738 may surround the storage node material 721 except at defined positions where the working surface 701, the first and second nitride materials 705, and 708 of the lattice support structures are attached to the storage node material 721.

Formation of the capacitors and semiconductor structure as just described may be utilized in fabrication of a memory device that includes at least one memory cell. Such a memory cell may include at least one such capacitor, as a data storage element, that is supported by the semiconductor structure. The memory cell also may include at least one access device (e.g., transistor) (not shown) that is, or may be, coupled to the at least one capacitor.

Figure 8:
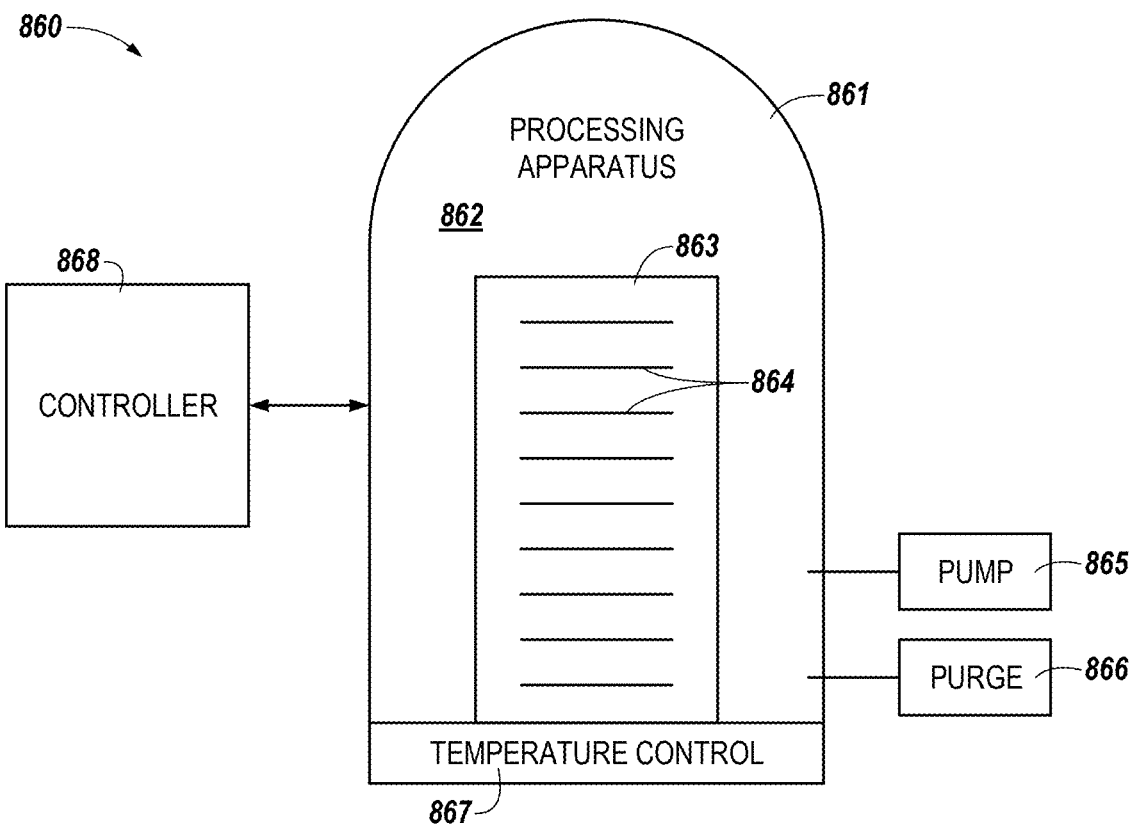
FIG. 8 illustrates a functional block diagram of an example computing system including a semiconductor structure of a memory system in accordance with a number of examples of the present disclosure.

FIG. 8 is a functional block diagram of a system 860 for implementation of an example semiconductor fabrication process in accordance with a number of embodiments of the present disclosure. The system 860 can include a processing apparatus 861. The processing apparatus 861 can be configured to enable depositing a storage node material.

The processing apparatus 861 can include a semiconductor processing chamber 862 to enclose components configured to deposit a storage node material. The chamber 862 can further enclose a carrier 863 to hold a batch of semiconductor wafers 864 (e.g., the working surface 101). The processing apparatus 861 can include and/or be associated with tools including, for example, a pump 865 unit and a purge 866 unit configured to introduce and remove reactants. In one example, the reactants may include precursors/reducing agents. The processing apparatus 861 can further include a temperature control 867 unit configured to maintain the chamber 862 at appropriate temperatures as described herein.

The system 860 can further include a controller 868. The controller 868 can include, or be associated with, circuitry and/or programming for implementation of, for instance, depositing a storage node material. Adjustment of such deposition and purging operations by the controller 868 can control the thickness of the materials described herein (the substrate material, the first silicate material, the first nitride material, the second silicate material, the second nitride material, and the third silicate material).

The controller 868 can, in a number of embodiments, be configured to use hardware as control circuitry. Such control circuitry may, for example, be an application specific integrated circuit (ASIC) with logic to control fabrication steps, via associated deposition and purge processes, for depositing a storage node material.

Figure 9:
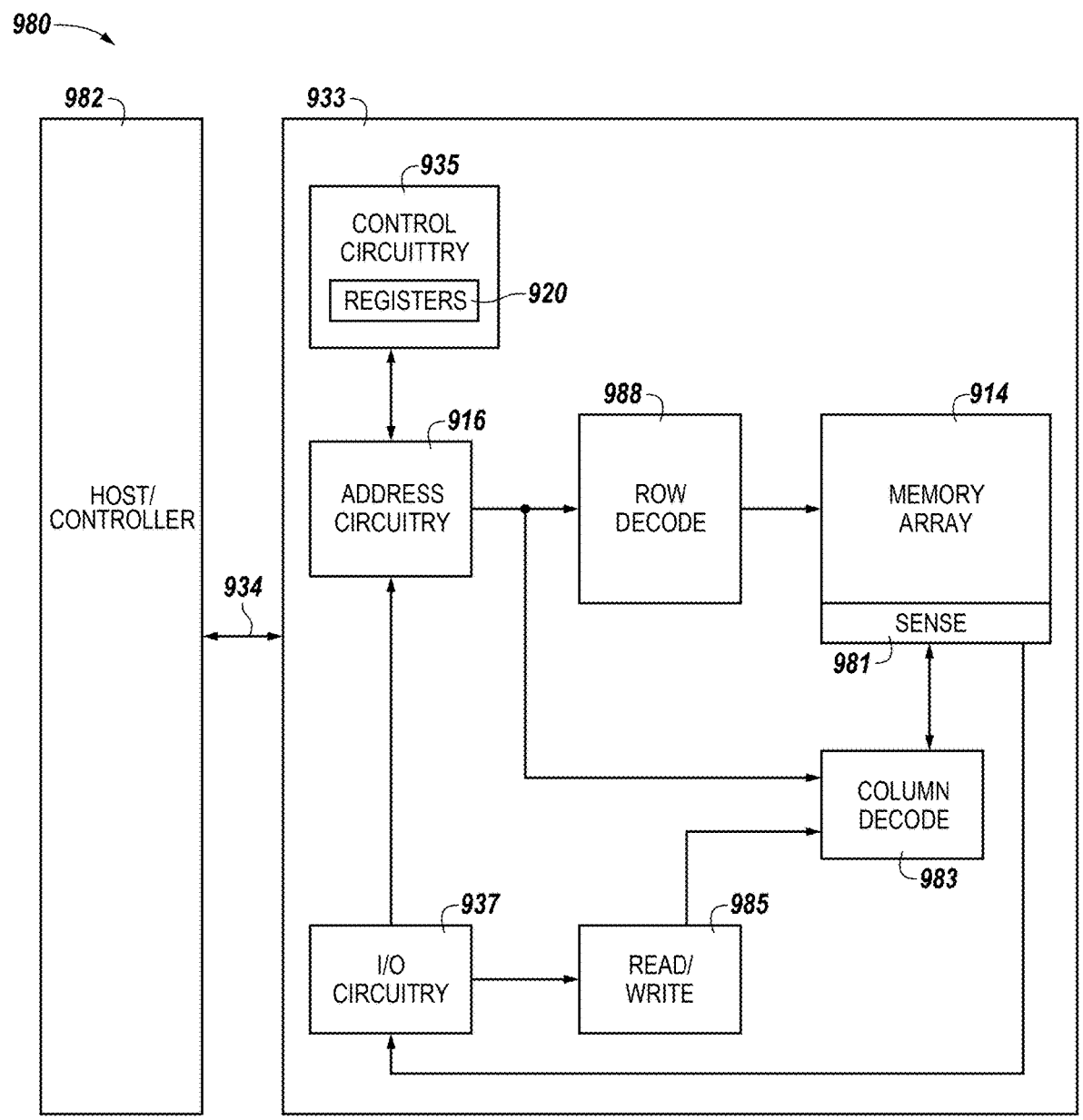
FIG. 9 illustrates a block diagram of an apparatus in the form of a computing system including a memory device in accordance with a number of embodiments of the present disclosure.

FIG. 9 is a block diagram of an apparatus in the form of a computing system 980 including a memory device 933 in accordance with a number of embodiments of the present disclosure. As used herein, a memory device 933, a memory array 914, and/or a host 982, for example, might also be separately considered an "apparatus." According to embodiments, the memory device 982 may comprise at least one memory array 914 with a memory cell formed having a digit line and body contact, according to the embodiments described herein.

In this example, system 980 includes a host 982 coupled to memory device 933 via an interface 934. The computing system 980 can be a personal laptop computer, a desktop computer, a digital camera, a mobile telephone, a memory card reader, or an Internet-of-Things (IoT) enabled device, among various other types of systems. Host 982 can include a number of processing resources (e.g., one or more processors, microprocessors, or some other type of controlling circuitry) capable of accessing memory 933. The system 980 can include separate integrated circuits, or both the host 982 and the memory device 933 can be on the same integrated circuit. For example, the host 982 may be a system controller of a memory system comprising multiple memory devices 933, with the system controller 935 providing access to the respective memory devices 933 by another processing resource such as a central processing unit (CPU).

In the example shown in FIG. 9, the host 982 is responsible for executing an operating system (OS) and/or various applications (e.g., processes) that can be loaded thereto (e.g., from memory device 933 via controller 935). The OS and/or various applications can be loaded from the memory device 933 by providing access commands from the host 982 to the memory device 933 to access the data comprising the OS and/or the various applications. The host 982 can also access data utilized by the OS and/or various applications by providing access commands to the memory device 933 to retrieve said data utilized in the execution of the OS and/or the various applications.

For clarity, the system 980 has been simplified to focus on features with particular relevance to the present disclosure. The memory array 914 can be a DRAM array comprising at least one memory cell having a digit line and body contact formed according to the techniques described herein. For example, the memory array 914 can be a 4F2 array. The array 914 can comprise memory cells arranged in columns coupled by word lines (which may be referred to herein as access lines or select lines) and rows coupled by digit lines (which may be referred to herein as sense lines or data lines). Although a single array 914 is shown in FIG. 9, embodiments are not so limited. For instance, memory device 933 may include a number of arrays 914 (e.g., a number of banks of DRAM cells).

The memory device 933 includes address circuitry 916 to latch address signals provided over an interface 934. The interface can include, for example, a physical interface employing a suitable protocol (e.g., a data bus, an address bus, and a command bus, or a combined data/address/command bus). Such protocol may be custom or proprietary, or the interface 934 may employ a standardized protocol, such as Peripheral Component Interconnect Express (PCIe), Gen-Z, CCIX, or the like. Address signals are received and decoded by a row decoder 988 and a column decoder 983 to access the memory array 914. Data can be read from memory array 914 by sensing voltage and/or current changes on the sense lines using sensing circuitry 981. The sensing circuitry 981 can comprise, for example, sense amplifiers that can read and latch a page (e.g., row) of data from the memory array 914. The I/O circuitry 937 can be used for bi-directional data communication with the host 982 over the interface 934. The read/write circuitry 985 is used to write data to the memory array 914 or read data from the memory array 914. As an example, the circuitry 985 can comprise various drivers, latch circuitry, etc.

Control circuitry 935 decodes signals provided by the host 982. The signals can be commands provided by the host 982. These signals can include chip enable signals, write enable signals, and address latch signals that are used to control operations performed on the memory array 914, including data read operations, data write operations, and data erase operations. In various embodiments, the control circuitry 935 is responsible for executing instructions from the host 982. The control circuitry 935 can comprise a state machine, registers 920, a sequencer, and/or some other type of control circuitry, which may be implemented in the form of hardware, firmware, or software, or any combination of the three. In some examples, the host 982 can be a controller external to the memory device 933. For example, the host 982 can be a memory controller which is coupled to a processing resource of a computing device.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to trimming a semiconductor structure have been illustrated and described herein, examples of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to trimming a semiconductor structure using oxygen than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A method, comprising:
    forming an opening in a pattern of materials;
    performing an etch to over-sculpt the opening;
    depositing a storage node material in the over-sculpted opening to form an over-sculpted storage node;
    performing an etch to remove portions of the pattern of materials; and
    performing an etch on the storage node material to trim the over-sculpted storage node, including:
        a top portion with a first distal end;
        a bottom portion with a second distal end; and
        over-sculpted sidewalls extending from the first distal end to the second distal end, wherein a first thickness at the first distal end and a second thickness at the second distal end are greater than a third thickness at a location between the first distal end and the second distal end, and wherein the top portion is uniformly tapered from the first thickness to the third thickness, and wherein the bottom portion is uniformly tapered from the second thickness to the third thickness.

2. The method of claim 1, further comprising performing the etch to over-sculpt the opening using a vapor etch.

3. The method of claim 1, further comprising performing the etch to over-sculpt the opening for an amount of time in a range from 1-15 seconds.

4. The method of claim 1, further comprising depositing a nitride material as the storage node material.

5. A method, comprising:
    depositing a pattern of materials;
    forming an opening in the pattern of materials;
    performing an oxidative etch on sidewall of opening to form an over-sculpted opening;
    depositing a storage node material in the over-sculpted opening to form an over-sculpted storage node;
    performing an etch to remove portions of the pattern of materials; and
    performing an etch on the storage node material to trim the over-sculpted storage node, the over-sculpted storage node including:
        a top portion with a first distal end;
        a bottom portion with a second distal end; and
        over-sculpted sidewalls extending from the first distal end to the second distal end, wherein a first thickness at the first distal end and a second thickness at the second distal end are greater than a third thickness at a location between the first distal end and the second distal end.

6. The method of claim 5, wherein performing the etch on the storage node material further comprises performing a vapor etch on the storage node material.

7. The method of claim 5, wherein forming the opening further comprises performing a dry etch on the pattern of material to form the opening.

8. The method of claim 5, wherein performing the etch to remove portions of the pattern of materials further comprises performing a wet etch, wherein the wet etch is performed with a hydrofluoric acid solution (HF).

9. The method of claim 5, wherein performing the etch on the storage node material further comprising performing a wet etch.

10. The method of claim 9, wherein performing the etch on the storage node material further comprise performing a wet etch, wherein the wet etch is performed with ammonium hydroxide.

11. An apparatus, comprising:
    an over-sculpted storage node including:
        a top portion with a first distal end;
        a bottom portion with a second distal end; and
        over-sculpted sidewalls extending from the first distal end to the second distal end, wherein a first thickness at the first distal end and a second thickness at the second distal end are greater than a third thickness at a location between the first distal end and the second distal end, and wherein the top portion is uniformly tapered from the first thickness to the third thickness, and wherein the bottom portion is uniformly tapered from the second thickness to the third thickness; and,
    a top electrode.

12. The apparatus of claim 11, wherein the first thickness and the second thickness are substantially equal.

13. The apparatus of claim 11, wherein the location between the first distal end and the second distal end is at an interface between the top portion and the bottom portion.

14. The apparatus of claim 11, wherein the third thickness is at least 5 angstroms less than both the first thickness and the second thickness.

15. The apparatus of claim 11, wherein a semiconductor structure on the side of the over-sculpted storage node includes oxide materials separated by nitride materials.

16. The apparatus of claim 11, wherein the top portion is formed of top portion may be formed of a tetraethyl orthosilicate (TEOS) material.

17. The apparatus of claim 11, wherein the bottom portion is formed of a borophosphosilicate glass (BPSG) material.

18. The apparatus of claim 11, wherein a height of the over-sculpted storage node is greater than or equal to 10,000 Angstroms.

19. An apparatus, comprising:
an over-sculpted storage node including:
 a top portion with a first distal end;
 a bottom portion with a second distal end; and
 over-sculpted sidewalls extending from the first distal end to the second distal end, wherein a first thickness at the first distal end and a second thickness at the second distal end are greater than a third thickness at a location between the first distal end and the second distal end, and wherein the over-sculpted sidewalls have a surface roughness of less than or equal to 1.2 nanometers; and
a top electrode.

* * * * *